(12) United States Patent
Manipatruni et al.

(10) Patent No.: US 10,062,731 B2
(45) Date of Patent: Aug. 28, 2018

(54) SPIN-ORBIT LOGIC WITH CHARGE INTERCONNECTS AND MAGNETOELECTRIC NODES

(71) Applicant: Intel Corporation, Santa Clara, CA (US)

(72) Inventors: Sasikanth Manipatruni, Portland, OR (US); Dmitri E. Nikonov, Beaverton, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/523,324

(22) PCT Filed: Dec. 26, 2014

(86) PCT No.: PCT/US2014/072447
§ 371 (c)(1),
(2) Date: Apr. 28, 2017

(87) PCT Pub. No.: WO2016/105436
PCT Pub. Date: Jun. 30, 2016

(65) Prior Publication Data
US 2017/0243917 A1 Aug. 24, 2017

(51) Int. Cl.
*H03K 19/20* (2006.01)
*H01L 27/22* (2006.01)
(Continued)

(52) U.S. Cl.
CPC ........... *H01L 27/22* (2013.01); *H03K 19/173* (2013.01); *H03K 19/18* (2013.01)

(58) Field of Classification Search
None
See application file for complete search history.

(56) References Cited

U.S. PATENT DOCUMENTS 9,379,313 B2 * 6/2016 Behin-Aein ............ H01L 43/08
2006/0164124 A1 7/2006 Koch et al.
(Continued)

FOREIGN PATENT DOCUMENTS

JP 2012049403 3/2012

OTHER PUBLICATIONS

Intel Corporation, "International search report and written opinion", PCT Application No. PCT/US2014/072447, (dated Sep. 25, 2015).

*Primary Examiner* — Anh Tran
(74) *Attorney, Agent, or Firm* — Schwabe, Williamson & Wyatt, P.C.

(57) ABSTRACT

An apparatus including a spin to charge conversion node; and a charge to spin conversion node, wherein an input to the spin to charge conversion node produces an output at the charge to spin conversion node. An apparatus including a magnet including an input node and output node, the input node including a capacitor operable to generate magnetic response in the magnet and the output node including at least one spin to charge conversion material. A method including injecting a spin current from a first magnet; converting the spin current into a charge current operable to produce a magnetoelectric interaction with a second magnet; and changing a direction of magnetization of the second magnet in response to the magnetoelectric interaction. A method including injecting a spin current from an input node of a magnet; and converting the spin current into a charge current at an output node of the magnet.

23 Claims, 8 Drawing Sheets

(51) Int. Cl.
    *H03K 19/18*     (2006.01)
    *H03K 19/173*     (2006.01)

(56) References Cited

U.S. PATENT DOCUMENTS

| | | |
|---|---|---|
| 2011/0001473 A1 | 1/2011 | Moriyama et al. |
| 2012/0176154 A1* | 7/2012 | Behin-Aein .......... H03K 19/16 326/37 |
| 2013/0200446 A1 | 8/2013 | Wunderlich et al. |
| 2016/0169988 A1* | 6/2016 | Sirringhaus ........ G01R 33/1284 324/251 |

* cited by examiner

US 10,062,731 B2

SPIN-ORBIT LOGIC WITH CHARGE INTERCONNECTS AND MAGNETOELECTRIC NODES

CROSS-REFERENCE TO RELATED APPLICATION

This patent application is a U.S. National Phase Application under 35 U.S.C. § 371 of International Application No. PCT/US2014/072447, filed Dec. 26, 2014, entitled "SPIN-ORBIT LOGIC WITH CHARGE INTERCONNECTS AND MAGNETOELECTRIC NODES."

BACKGROUND

Field

Integrated circuit devices.

Description of Related Art

Spintronic logic describes a class of integrated circuit devices utilizing a physical variable of magnetization or spin as a computation variable. Non-volatile logic can improve the power and computational efficiency by allowing architects to put a processor to un-powered sleep states more often enabling computation with less energy.

Existing spintronic logic options generally suffer from high energy and relatively long switching timers due to the inefficiency of mechanisms for converting charge to spin variables and vice versa. In particular, this results in large write currents (on the order of 100 microamperes per bit (μA/bit) producing high Joule heat dissipation, and slow switching time (on the order of 10 nanoseconds (ns)) over which the current needs to be "on".

DETAILED DESCRIPTION

In one embodiment, a circuit apparatus or device is described that combines the physical phenomena of 'spin to charge' and 'charge to spin' conversion. Spin to charge conversion is achieved via an inverse Rashba-Edelstein effect or inverse spin Hall effect where a spin current injected from an input magnet produces a charge current, a sign of which is determined by a direction of magnetization. Charge to spin conversion is achieved by way of a direct magnetoelectric effect in which the charge current produces a voltage on a capacitor leading to switching magnetization of an output magnet or a hybrid or cascaded effect where, for example, combinations of materials that achieve a magnetoelectric effect through cascading of two transductions or physical phenomena in materials, such as a voltage to strain transduction and a strain to magnetization transduction. An apparatus that combines or connects, for example, a spin to charge device and a charge to spin device offers high speed logic operation (e.g., on the order of 100 picoseconds (ps)) via the use of magnetoelectric switching and reduced switching energy (e.g., 1 attojoule (aJ) to 10 aJ) because a current needs to be "on" for a relatively short time (e.g., on the order of 3 ps) and the driving supply voltage is relatively low.

Figure 1:
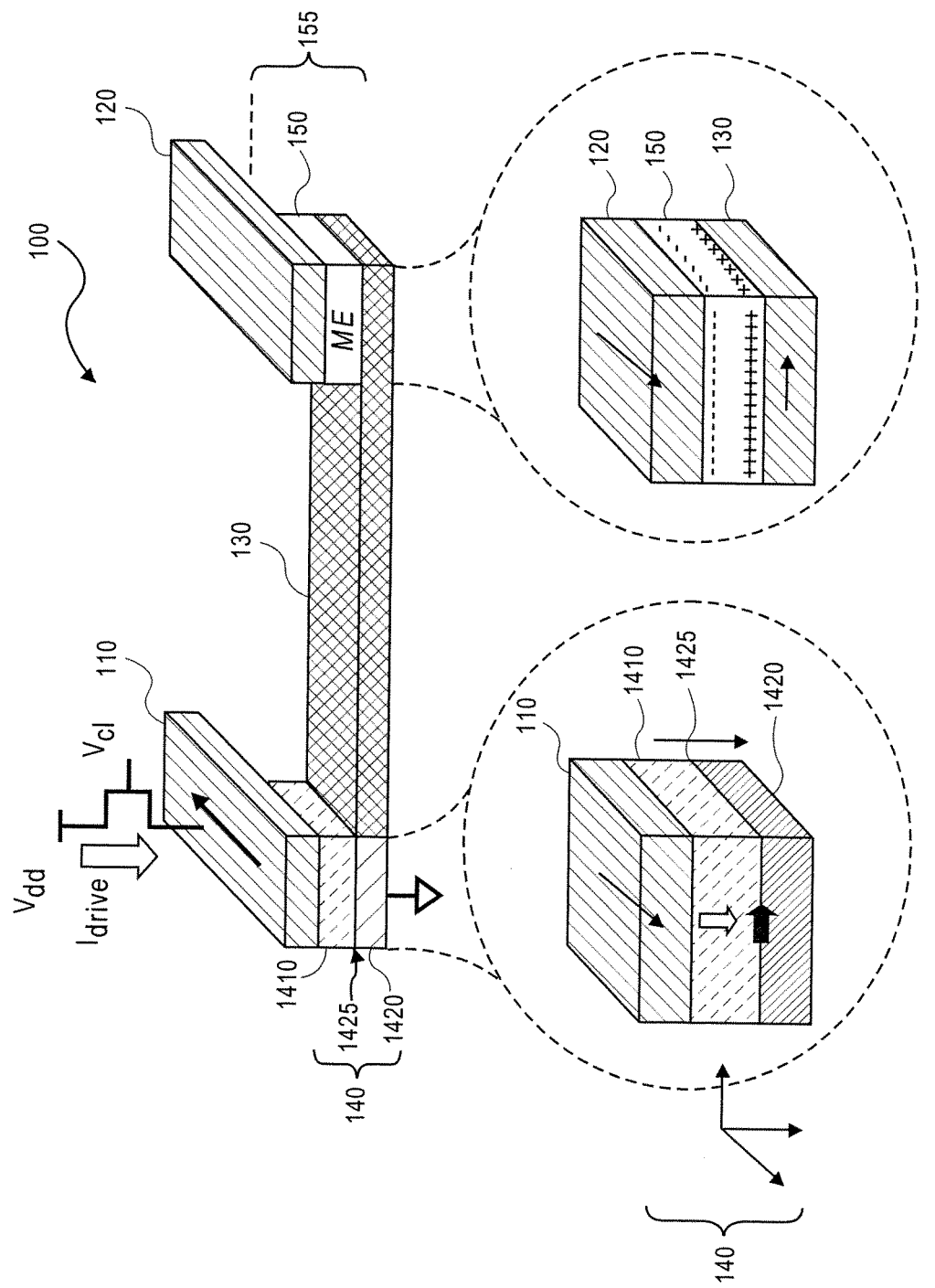
FIG. 1 shows a top perspective side of an embodiment of a spin-orbit logic (SOL) device with magnetoelectric switching as well as an operating mechanism for injection of a signal and detection.

FIG. 1 shows a top perspective side view of an embodiment of a spin-orbit device. SOL device 100 includes two nanomagnets connected by a channel acting as a charge interconnect. Device 100 includes magnet 110 (e.g., a nanomagnet) and magnet 120 (e.g., a nanomagnet) each of a ferromagnetic material such as Co, Fe, Ni, Gd and their alloys, as well as ferromagnets of the Huesler alloy family of the form $X_2YZ$ or XYZ where X, Y, Z can be elements of Co, Fe, Ni, Al, Ge, Ga, Gd, Mn, etc. Magnet 110 is connected to magnet 120 by channel 130 of an electrically conductive material such as a copper material or 2D conducting channels such as graphene, molybdenum disulfide ($MoS_2$).

Magnet 110 is connected to spin orbit effect stack 140 that defines a spin to charge conversion node. Spin-orbit effect stack 140, in one embodiment, includes non-magnetic metal material 1410 such as silver (Ag), aluminum (Al), gold (Au) or copper (Cu) connected to spin orbit coupling material 1420 that is a material or materials that will exhibit a spin orbit effect in a metallic system. Representative material for spin orbit coupling material 1420 is an element of group V of the Periodic Table of Elements and their alloys (e.g., bismuth, bismuth-silver alloys) or traditional interconnect materials (copper (Cu), gold (Au), silver (Ag), aluminum (Al) doped with the high atomic weight transition elements that will produce a strong or high spin orbit coupling (SOC) at the interface of metal material 1410 and spin orbit coupling material 1420 (interface 1425) (this is on the order of 0.01 nanometers (nm) to 100 nm (1 nm is closer to the measured reported value)) or a bulk material with high spin Hall effect (SHE) coefficient (e.g., on the order of 0.01 to 10 or greater (e.g., 0.1 to 1)) such as tantalum (Ta), tungsten (W), or platinum (Pt), or high atomic weight transition elements such as lutetium (Lu), hafnium (Hf), rhodium (Rh), osmium (Os), iridium (Ir), gold (Au), mercury (Hg). In the embodiment shown in FIG. 1, non-magnetic material 1410 is disposed on (deposited on) spin orbit coupling material 1420 with an interface in between or therebetween. In one embodiment, interface 1425 of non-magnetic metal material 1410 and spin orbit coupling material 1420 illustrated in FIG. 1 is a high density two-dimensional electron gas where charge and spin currents are correlated. In one embodiment, there may be a spacer such as a non-magnetic material (e.g., silver or copper) spacer at the top of the spin orbit effect stack 140 (top as viewed).

Magnet 110 injects a spin current into spin orbit effect stack 140. An energy to produce the spin current is provided by a voltage supply connected to magnet 110. The direction of magnetization of the spin current is determined by a magnetization of magnet 110.

The spin-orbit mechanism responsible for spin to charge conversion is described by a Rashba effect in a two-dimensional electron gas. The Hamiltonian (energy) of spin-orbit coupling electrons in a two-dimensional electron gas is:

$$H_R = \alpha_R (k \times \hat{z}) \cdot \vec{\sigma}$$

As shown in FIG. 1, spin polarized electrons with direction of magnetization in-plane (in the xy-plane) experience an effective magnetic field dependent on the spin direction:

$$\vec{B}(k) = \frac{\alpha_R}{\mu_B} (\vec{k} \times \hat{z})$$

This results in the generation of a charge current in the interconnect proportional to the spin current. The spin-orbit interaction Ab/Bi interface (the inverse Rashba-Edelstein effect (TREE)) produces a charge current in the horizontal direction:

$$I_c = \frac{\lambda_{IRRE} I_s}{w_m}$$

Alternatively, the inverse spin Hall effect (ISHE) in Ta, W, or Pt produces the horizontal charge current:

$$I_c = \frac{\Theta_{SHE} t_{she} I_s}{2 w_m}$$

Both IREE and ISHE effects produce spin to charge current conversion efficiency around 0.1 with existing materials and a 10 nm magnet width. For scaled nanomagnets (5 nm width) and a SHE material such as $Bi_2Se_3$, the spin to charge conversion efficiency can be between 1 and 2.5.

The net conversion of the drive charge current to magnetization dependent charge current may be represented by:

$$I_c = \pm \frac{\lambda_{IRRE} P I_d}{w_m}$$

for IREE and $$I_c = \pm \frac{\Theta_{SHE} t_{she} P I_d}{2 w_m}$$

for ISHE, where P is the spin direction of magnetization. Setting a drive current and signal charge current at 100 microamperes ($I_c = I_d = 100$ μA) and estimating the resistance of the ISHE interface to be equal to 100 ohms (R=100 Ω), provides an induced voltage to be equal to $V_{ISHE} = 10$ mV.

The charge current created at the spin to charge conversion node of SOL device 100 (created at the spin orbit effect stack 140) is carried by interconnect 130. Interconnect 130 of, for example, a copper material is connected at one end to spin orbit effect stack 140 to capacitor 155 at another end. Capacitor 155 defines an output node of the device that includes the interconnect and magnet 120 as electrical conductors or plates separated by magnetoelectric dielectric material 150 such as bismuth ferrite (BFO), chromium (III) oxide ($Cr_2O_3$) or magnesium oxide (MgO). In one embodiment, a material for material 150 is a single material that directly produce a magnetoelectric effect and, in another embodiment, is a combination of materials such as multiple layers of oxides and intermetallics that define a dielectric stack. Such combination of materials may achieve a magnetoelectric effect through, for example, cascading of two transductions or physical phenomena in materials (e.g., cascading of a voltage to strain transduction and a strain to magnetization transduction). The charge current carried by interconnect 130 produces a voltage on capacitor 155 including magnetoelectric dielectric material 150 in contact with magnet 120. Typical magnetoelectric materials are either intrinsic multiferroics or composite multiferroic structures. As the charge accumulates on the magnetoelectric capacitor, a strong magnetoelectric interaction causes a switching of magnetization in magnet 120. Switching of a direction of magnetization in magnet 120 is a result of an exchange bias for a dielectric material such as BFO that creates a surface magnetization under applied voltage to switch magnet 120; or a result of magnetostrictive stress anisotropy in a ferromagnetic material such as Fe3Ga or lead-zirconium-titinate (PZT); or surface anisotropy as a result of application of a voltage to a dielectric material such as MgO.

In one embodiment, magnetoelectric capacitor 155 representatively has the following parameters:

thickness $t_{ME}=5$ nm, dielectric constant ε=500, area A=60 nm×20 nm. Then the capacitance is given by:

$$C = \frac{\varepsilon \varepsilon_0 A}{t_{ME}} \approx 1 \; fF.$$

Demonstrated values of the magnetoelectric coefficient is $\alpha_{ME} \sim 10/c$, where the speed of light is c. This translates to an effective magnetic field exerted on magnet 120 of about 0.06 Tesla (T):

$$B_{ME} = \alpha_{ME} E = \frac{\alpha_{ME} V_{ISHE}}{t_{ME}} \sim 0.06 T$$

This is a strong field sufficient to switch the direction of magnetization in magnet 120. The charge on capacitor 155, Q=1fF*10 mV=10 aC, and the time to fully charge the capacitor to the induced voltage is $t_d = 10 \; Q/I_d \sim$ ps (accounting for the decreased voltage difference as the capacitor charges). If the driving voltage is $V_d = 100$ mV, then the energy to switch is $$E_{sw} \sim 100 \; mV * 100 \; \mu A * 1 \; ps \sim 10 \; aJ,$$

which is comparable to the switching energy of CMOS transistors.

The time to switch magnetization remains much longer than a charging time and is determined by the magnetization precession rate. Representative micromagnetic simulations predict this time to be $t_{sw} \sim 100$ ps.

The insets of FIG. 1 show the effect of a drive or charge current on the SOL device. In this embodiment, a drive or charge current is introduced to magnet 110. The charge current causes a direction of magnetization of magnet 110 to change (see input node inset). A spin current is also created in spin orbit coupling material 1420 that creates a transverse charge current in interconnect 130 with a sign of the charge current determined by a direction of magnetization of magnet 110. The charge current produces a voltage on capacitor 155. The voltage will cause a switching of a direction of magnetization of magnet 120, in this example, to coincide with a direction of magnetization of magnet 110 (see output node inset).

SOL device 100, in one embodiment, is suitable as an integrated circuit device of a microprocessor or other component or one of many similar devices defining one or more circuits in the component. In one embodiment, materials of magnets 110/120, spin orbit effect stack 140, interconnect 130 and capacitor 155 may be introduced and patterned according to conventional semiconductor circuit processing techniques for introduction and patterning. The devices and logical operation layouts/schemes described in the following paragraphs may also be introduced and patterned according to conventional semiconductor processing techniques.

Figure 2:
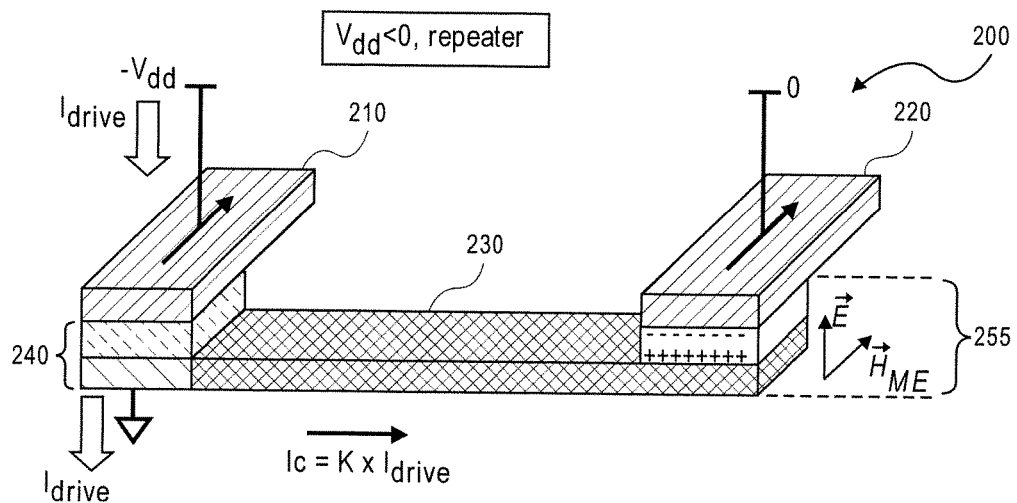
FIG. 2 shows a top perspective side view of an SOL device in a logic repeater operation.

An operation of an SOL device as a logic repeater is shown in FIG. 2. An energy to regenerate the logic signal is derived from a power supply driving the charge current during the injector operation. Referring to FIG. 2, in one embodiment, a logic repeater operation works by injection of a spin current from magnet 210 of device 200. For $-V_{dd}$ supply voltage applied to the magnet 210 (e.g., an injector nanomagnet), a spin current having a direction of magnetization in the same direction as the nanomagnet is injected into spin orbit effect stack 240. The spin orbit effect produces a charge current proportional to the injected spin current in channel 230. The injected charge current charges magnetoelectric stack 255 (negative on the top plate) producing a large effective magnetic field on magnet 220 and magnetization the same as the input magnet.

Figure 3:
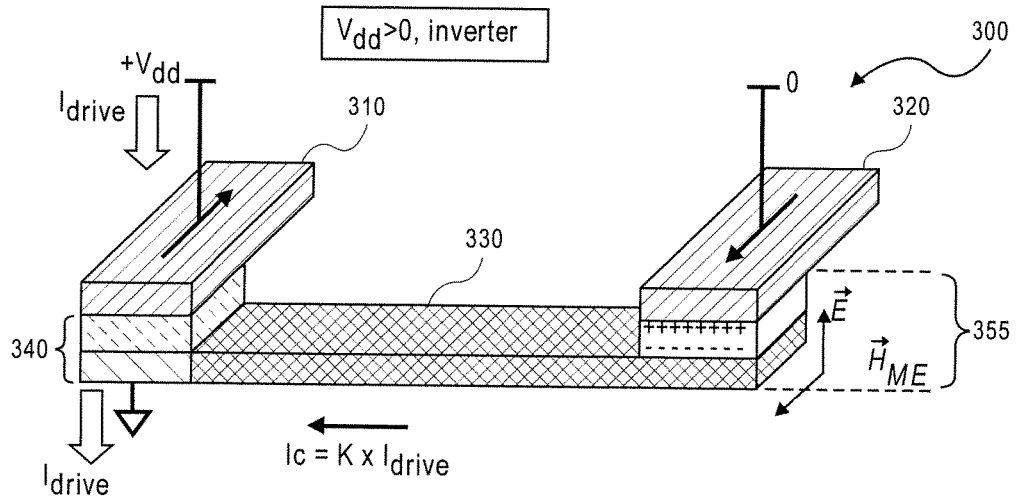
FIG. 3 shows a top perspective side view of an SOL device in a logic inverter operation.

An operation of an SOL device as a logic inverter is shown in FIG. 3. In one embodiment, logic inverter operation of device 300 in FIG. 3 works by injection of a spin current from the input magnet with a $+V_{dd}$ supply voltage. The injected spin current in spin orbit effect stack 340 produces a charge current in channel 330. The injected charge current charges a magnetoelectric stack with opposite sign of voltage (positive on top plate), producing a large effective magnetic field on the detector free layer or magnet 320 and the opposite magnetization to that on the input magnet.

The described SOL device provides logic cascadability and unidirectional signal propagation (i.e., input-output isolation). The unidirectional nature of logic is ensured due to a large difference in impedance for injection path relative to detection path. The injector is analogous to a metallic spin valve with spin to charge transduction with area resistance (RA) products on the order of about 10 mOhm.micron$^2$. A detection path is a low leakage capacitance with RA products significantly greater than 1 MOhm.micron$^2$ in series with a resistance of the FM capacitor plate with estimated resistance greater than 500 ohms.

Figure 4:
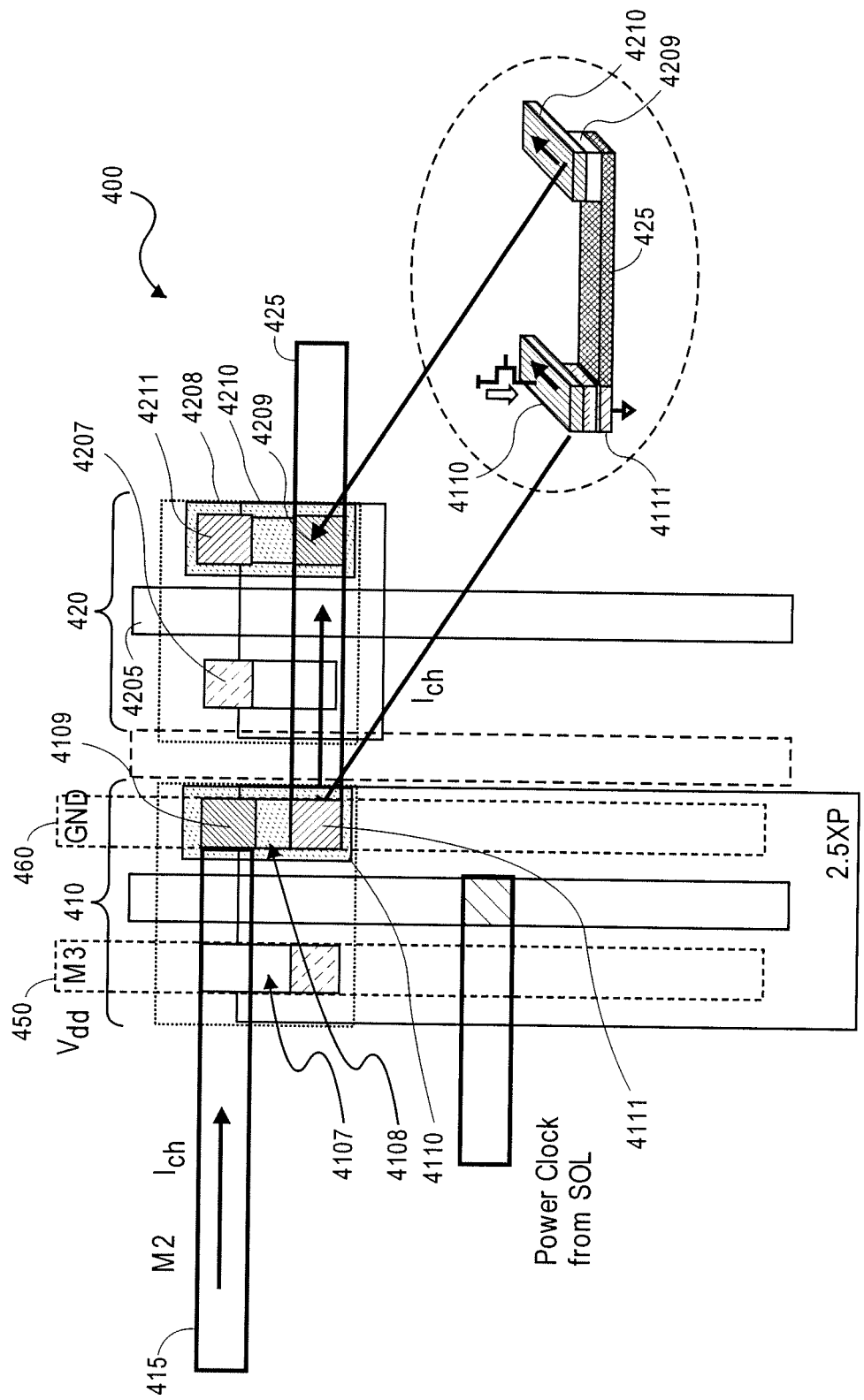
FIG. 4 shows a top layout view of CMOS integration of an SOL device.

An SOL device provides integration density with CMOS drive and control transistors. FIG. 4 illustrates an embodiment of an integration scheme for a logic inverter stage with CMOS drivers for power supply and clocking. Referring to FIG. 4, scheme 400 includes transistor 410 including gate electrode 4105 and junction region 4107 (source region) and junction region 4108 (drain region). Also illustrated is transistor 420 including gate electrode 4205, and junction region 4207 and junction region 4208. Metal interconnect line 415 is connected to junction region 4108 of transistor 410 and metal interconnect line 425 (representatively at the same level as interconnect line 415) is connected to junction region 4108 and junction region 4208. Interconnect line 450 and interconnect line 460 (each representatively at a different level than interconnect line 415 and interconnect line 420) are connected to junction region 4107 and junction region 4108, respectively to provide power and ground.

FIG. 4 shows the incorporation of a spin orbit logic (SOL) device into scheme 400. As illustrated, the device includes two magnets each with two landing regions. Junction region 4108 includes magnet 4110 connected at one end to magnetoelectric material 4109 and at an opposite end to spin orbit effect stack 4111 (including a material that will exhibit a spin orbit effect in a metallic system (a IREE or spin Hall effect material)). Scheme 400 also includes magnet 4210 connected at one end to magnetoelectric material 4209 and at an opposite end to spin orbit effect stack 4211. Interconnect line 415 is connected to magnetoelectric material 4109 (to form a capacitor) and interconnect line 425 is connected to spin orbit effect stack 4111 and to magnetoelectric material 4209. In operation, a charge current introduced on interconnect line 415 switches a direction of magnetization of magnet 4110 and injects a spin current in magnet 4110 that is converted to a charge current in interconnect line 425 that switches a direction of magnetization of magnet 4210.

The illustration in FIG. 4 demonstrates the cascadability of an SOL device in particular the cascading of two gates. The density of integration of the devices illustrated in FIG. 4 exceeds that of CMOS since an inverter operation can be achieved within, for example, 2.5PX2M0. Since, in one embodiment, a power transistor can be shared among all the devices at the same clock phases, vertical integration can also be used to increase the logic density.

Figure 5:
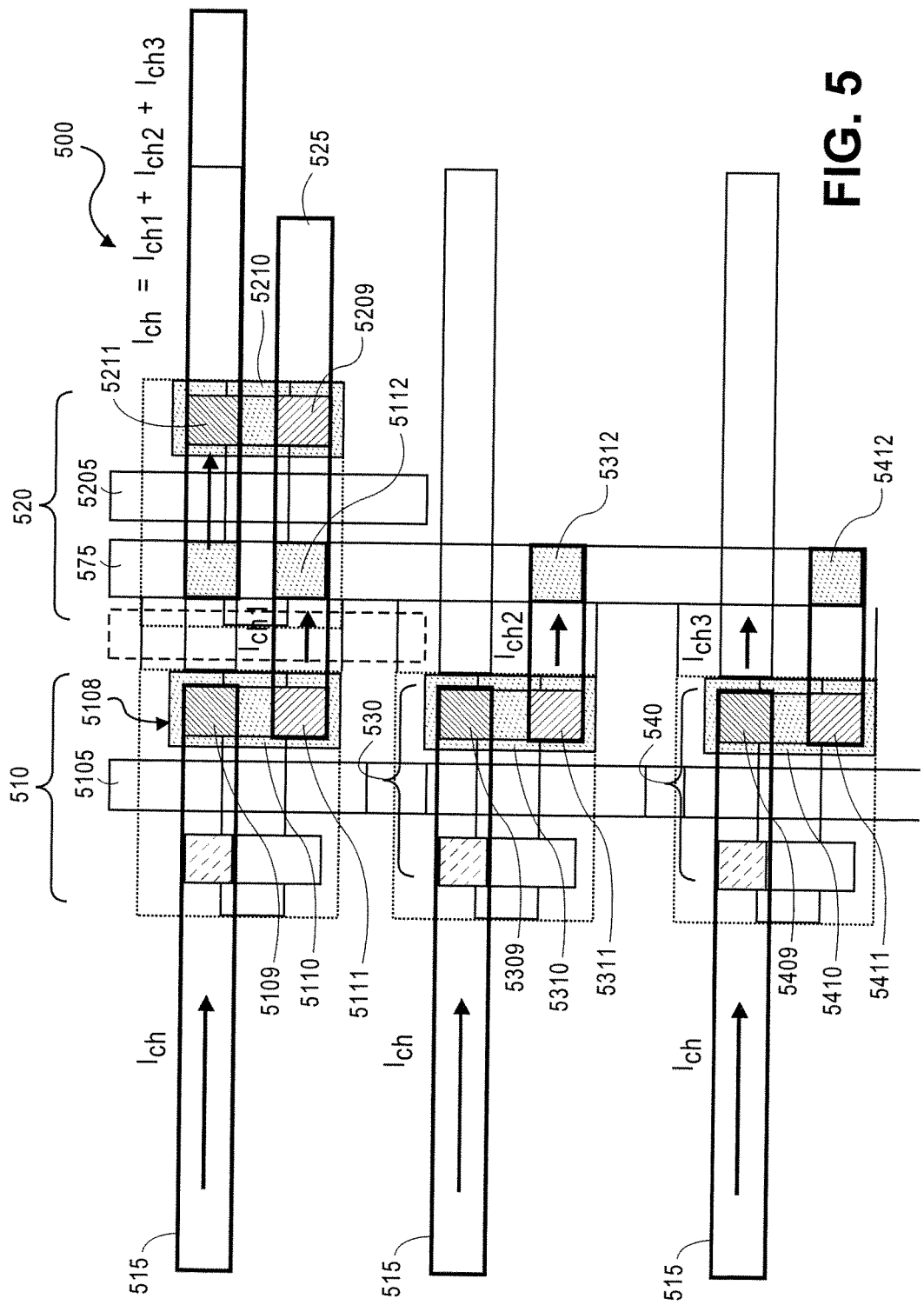
FIG. 5 shows a top layout view of a majority gate integrating SOL device.

A charge mediated majority gate is also possible using spin orbit coupling and magnetoelectric switching. A charge mediated majority gate is shown in FIG. 5. Referring to FIG. 5, scheme 500 includes transistor 510, transistor 530 and transistor 540 as inputs and transistor 520 as an output. Transistor 510 includes gate electrode 5105 source region 5107 and drain region 5108. Disposed in (deposited on or otherwise connected to) drain region is magnet 5110 connected at one end to magnetoelectric material 5109 and at another end to spin orbit effect stack 5111. Transistor 530 similarly includes a source region and drain region with the drain region including magnet 5310 coupled at one end to magnetoelectric material 5309 and at another end to spin orbit effect stack 5311. Transistor 540 similarly includes a source region and drain region with the drain region including magnet 5410 coupled at one end to magnetoelectric material 5409 and at another end to spin orbit effect stack 5411. Finally, transistor 520 includes gate electrode 5205 and source and drain regions with the drain region including a magnet connected at one end to spin orbit effect stack 5209 and at another end to magnetoelectric material 5211.

FIG. 5 shows interconnect line 515 (shown as three separate lines) connected to each of magnetoelectric material 5109, magnetoelectric material 5309 and magnetoelectric material 5409 of transistor 510, transistor 530 and transistor 540, respectively. Interconnect line 525 is shown connected to spin orbit effect stack 5111 of transistor 510 and to spin orbit effect stack 5209. In one embodiment, interconnect line 515 and interconnect line 525 are on the same level. FIG. 5 also shows metal interconnect line 575 perpendicular to interconnect line 515 and, in one embodiment, on another level than interconnect line 515 and interconnect line 525. Interconnect line 575 is connected to each of the spin orbit effect stack 5111, 5311 and 5411 of respective transistors 510, 530 and 540 and to similar spin orbit effect stack 5209 of transistor 520. In one embodiment, a charge current carries the information of the magnet beneath it (the charge current will have a direction of current flow depending on a magnet orientation that is representative of a logic state). In the embodiment of FIG. 5, the charge current into each of transistor 510, 530 and 540 ($I_{ch}$) will produce a charge current ($I_{ch1}$, $I_{ch2}$ and $I_{ch3}$, respectively) that represents an input to the transistor 520. For a logic operation, each of $I_{ch1}$, $I_{ch2}$, and $I_{ch3}$ is 0 or 1 and transistor 520 will receive the majority output of the input transistors (either 0 or 1 depending on whether there are more 0s than 1s among $I_{ch1}$, $I_{ch2}$ and $I_{ch3}$).

In the embodiment shown in FIG. 5, the three input stages share a common power/clock region therefore the power/clock gating transistor can be shared among the three inputs of the majority gate. The input stages can also be stacked vertically to improve the logic density.

State elements are used for clocked logic operation for synchronous and asynchronous (event driven) computing. Table 1 shows a representative truth table for a state element operation. If a control is 1, an output either follows the control (1) or is the inverse of the control (0). If a control is 0, the output will not respond to the control but will hold its previous state.

TABLE 1

| $In_{I+1}$ | Control | $Out_{I+1\ (V>0)}$ | $Out_{I+1\ (v>0)}$ |
|---|---|---|---|
| 1/0 | 1 | 1/0 | 0/1 |
| 1/0 | 0 | $Out_i$ | $Out_i$ |

Figure 6:
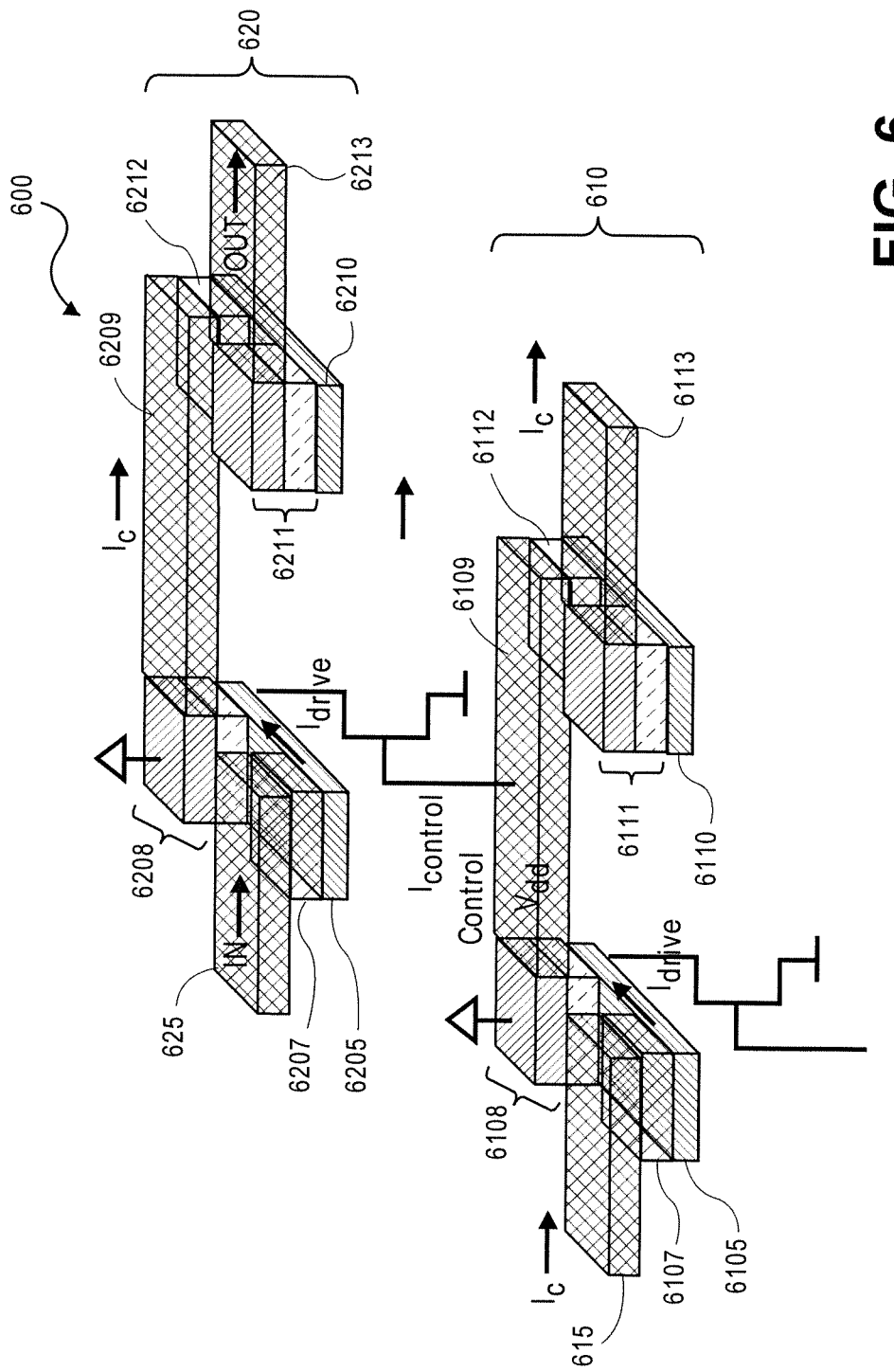
FIG. 6 illustrates a top perspective side view of two cascaded state elements using SOL devices with CMOS integration.

The nature of spin orbit logic where the interconnect is charge-based provides an ability to create state machines using the CMOS transistors. A state machine using SOL with CMOS integration is shown in FIG. 6. Referring to FIG. 6, assembly 600 includes SOL device 610 and SOL device 620. SOL device 610, in this embodiment, is a control logic. SOL device 610 includes magnet 6105 and magnet 6110. Deposited on a surface of magnet 6105 at one end is magnetoelectric material 6107 and, at another end, spin orbit effect stack 6108. Deposited on a surface of magnet 6110 at one end is magnetoelectric material 6111 and, at another end, spin orbit effect stack 6112. FIG. 6 shows interconnect or channel 6109 connected between spin orbit effect stack 6108 of magnet 6105 and magnetoelectric material 6112 of magnet 6110. Interconnect 615 is connected to magnetoelectric material 6107 on magnet 6105 and interconnect 6113 is connected to spin orbit effect stack 6111 on magnet 6110. Representatively, an input current ($I_c$) on interconnect 615 produces a voltage on magnetoelectric material 6107 to control magnet 6105, and then drive current (spin current) in magnet 6105 that is converted to a charge current or control current ($I_{control}$) in interconnect 6109.

SOL device 620, in one embodiment, is a repeater. SOL device 620 includes magnet 6205 and magnet 6210. Deposited on a surface of magnet 6205 at one end is magnetoelectric material 6207 and, at another end, spin orbit effect stack 6208. Deposited on a surface of magnet 6210 at one end is spin orbit effect stack 6211 and, at another end, magnetoelectric material 6212. FIG. 6 shows interconnect or channel 6209 connected between spin orbit effect stack 6208 of magnet 6205 and magnetoelectric material 6212 of magnet 6210. Interconnect 625 is connected to magnetoelectric material 6207 on magnet 6205 and interconnect 6213 is connected to spin orbit effect stack 6211 on magnet 6210. When SOL device 620 power is ON (i.e., drive current is flowing), the device functions as a repeater representatively receiving an input current on interconnect 625 and a charge current is repeated on interconnect 6213. Such input current produces a drive current (spin current) in magnet 6205 that is converted to a charge current in interconnect 6209 that controls the direction of magnetization of magnet 6210. The power to turn SOL device 620 ON is controlled with SOL device 610. SOL device 610 is connected to SOL device 620 and will produce a charge signal to turn power to device 620 ON or OFF.

Figure 7A:
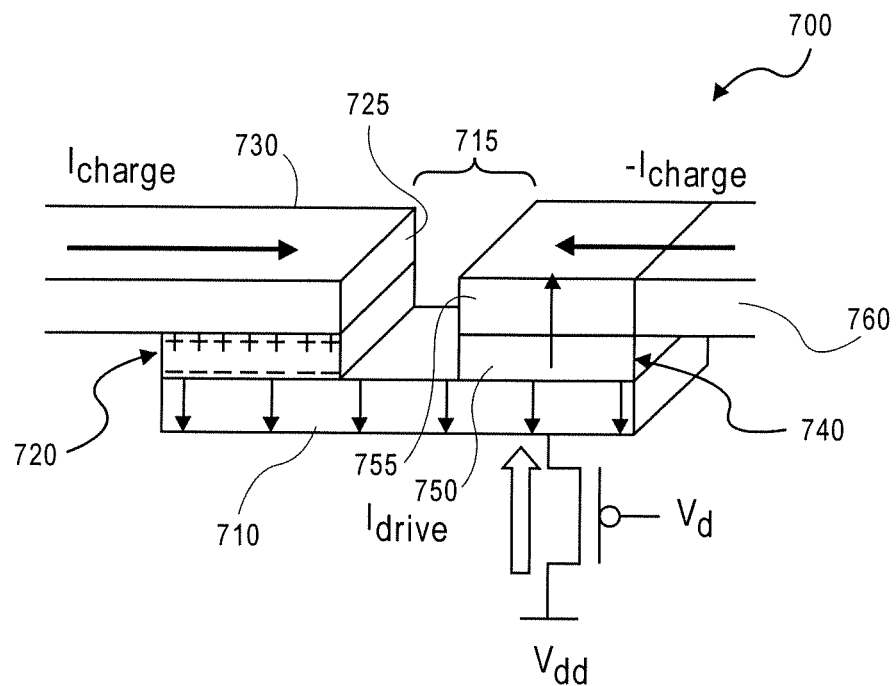
FIGS. 7A-7B show another embodiment of a spin-orbit logic device that has a logic function, specifically showing two different states of an inverting operation.
Figure 7B:
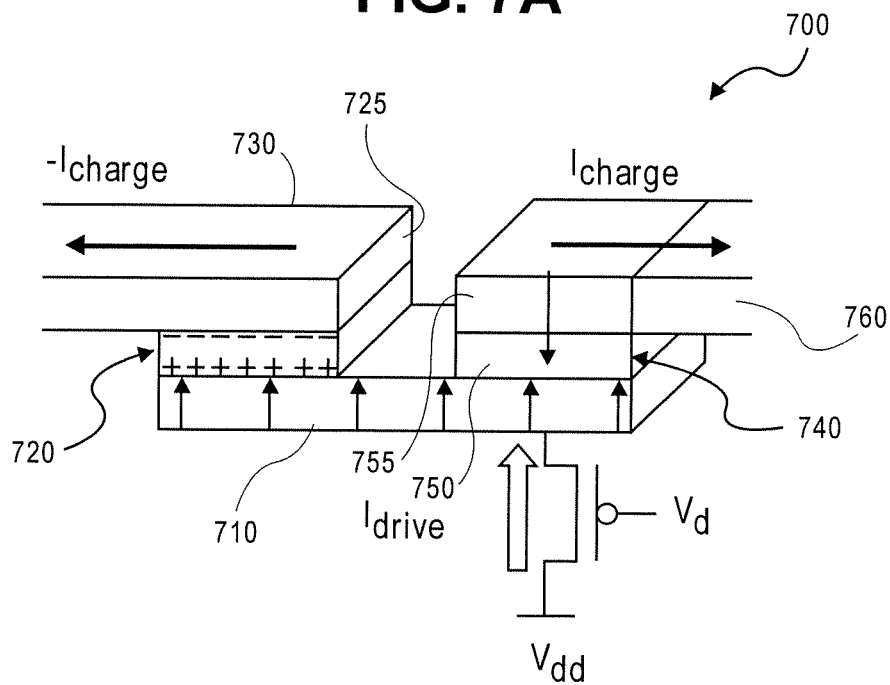

In an embodiment, an apparatus is disclosed that includes a magnet including an input node and an output node, the input node includes a capacitor operable to generate a magnetization in the magnet and the output node comprising a spin to charge conversion material. In this manner, a gate of a single magnet with two nodes is described where a charge current into a capacitor generates a voltage across the magnetoelectric material and magnetization in the magnet and the magnetization is converted to a charge current by spin orbit coupling material at the output node. FIG. 7 shows a device that has a logic function, specifically two different states of an inverting operation. Referring to FIG. 7, device 700 is represented by a single magnet 710 including input node 720 and output node 740, in this embodiment, at opposite ends of similar surface of magnet 710 separated by gap 715. Input node 720 is defined by a capacitor having electrodes of magnet 710 and interconnect 730 with magnetoelectric material 725 in between. Output node 740 includes spin orbit stack including spin orbit coupling material 750 and nonmagnetic metal material 755 connected to interconnect 760. A current from interconnect 730 produces a voltage across the magnetoelectric material and magnetization in magnet 710 at input node 720 and the spin current is converted to a charge current at output node 740. When charge flows left to right as in scenario (a), a direction of the output current is right to left (inverting operation). When charge flows right to left as in scenario (b), a direction of the output current is left to right. The description of an inverting operation is one example of a logical operation that can be performed by a device such as device 700 of a single magnet with an input and output node. Such device may used in other logical operations, including for example, state machine and majority gate operations.

Figure 8:
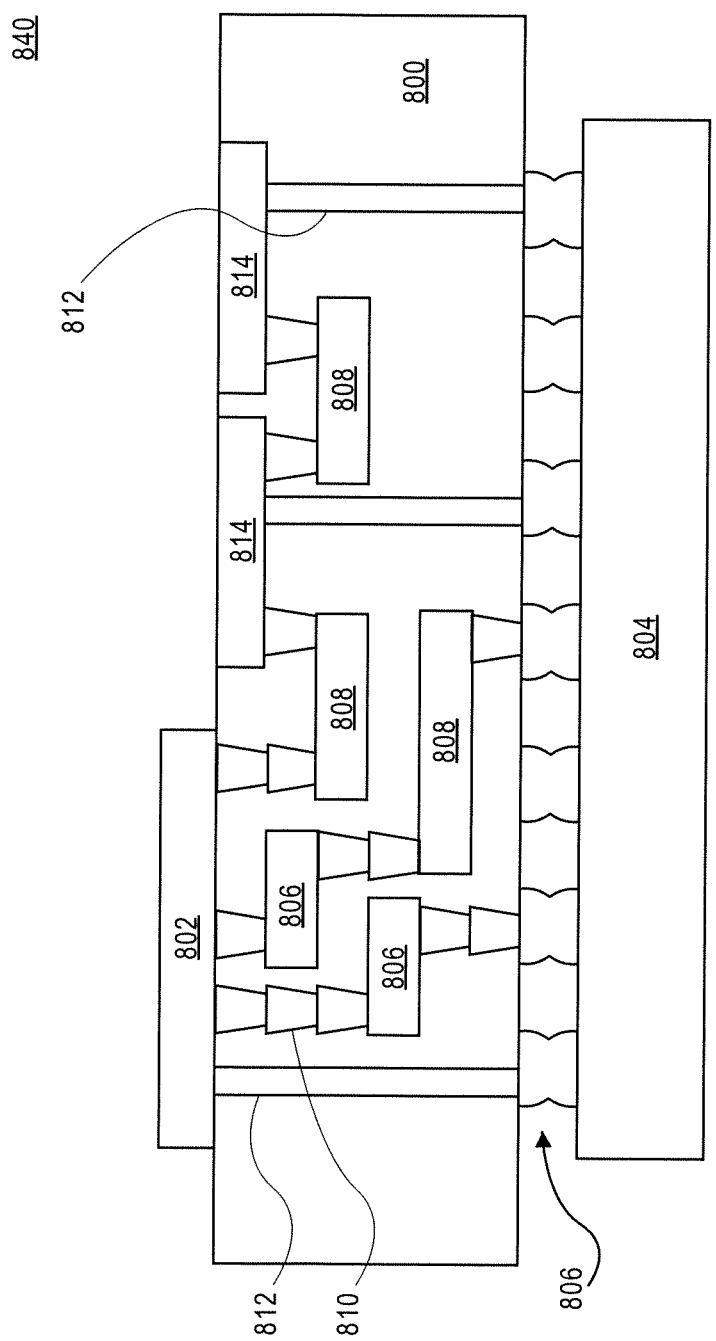
FIG. 8 is an interposer implementing one or more embodiments.

FIG. 8 illustrates an interposer 800 that includes one or more embodiments. Interposer 800 is an intervening substrate used to bridge first substrate 802 to second substrate 804. First substrate 802 may be, for instance, an integrated circuit die. Second substrate 804 may be, for instance, a memory module, a computer motherboard, or another integrated circuit die. Generally, the purpose of interposer 800 is to spread a connection to a wider pitch or to reroute a connection to a different connection. For example, interposer 800 may couple an integrated circuit die to ball grid array (BGA) 806 that can subsequently be coupled to second substrate 804. In some embodiments, first and second substrates 802/804 are attached to opposing sides of interposer 800. In other embodiments, first and second substrates 802/804 are attached to the same side of interposer 800. And in further embodiments, three or more substrates are interconnected by way of interposer 800.

Interposer 800 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

Interposer 800 may include metal interconnects 808 and vias 810, including but not limited to through-silicon vias (TSVs) 812. Interposer 800 may further include embedded devices 814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on interposer 800.

In accordance with embodiments of the invention, apparatuses or processes disclosed herein may be used in the fabrication of interposer 800.

Figure 9:
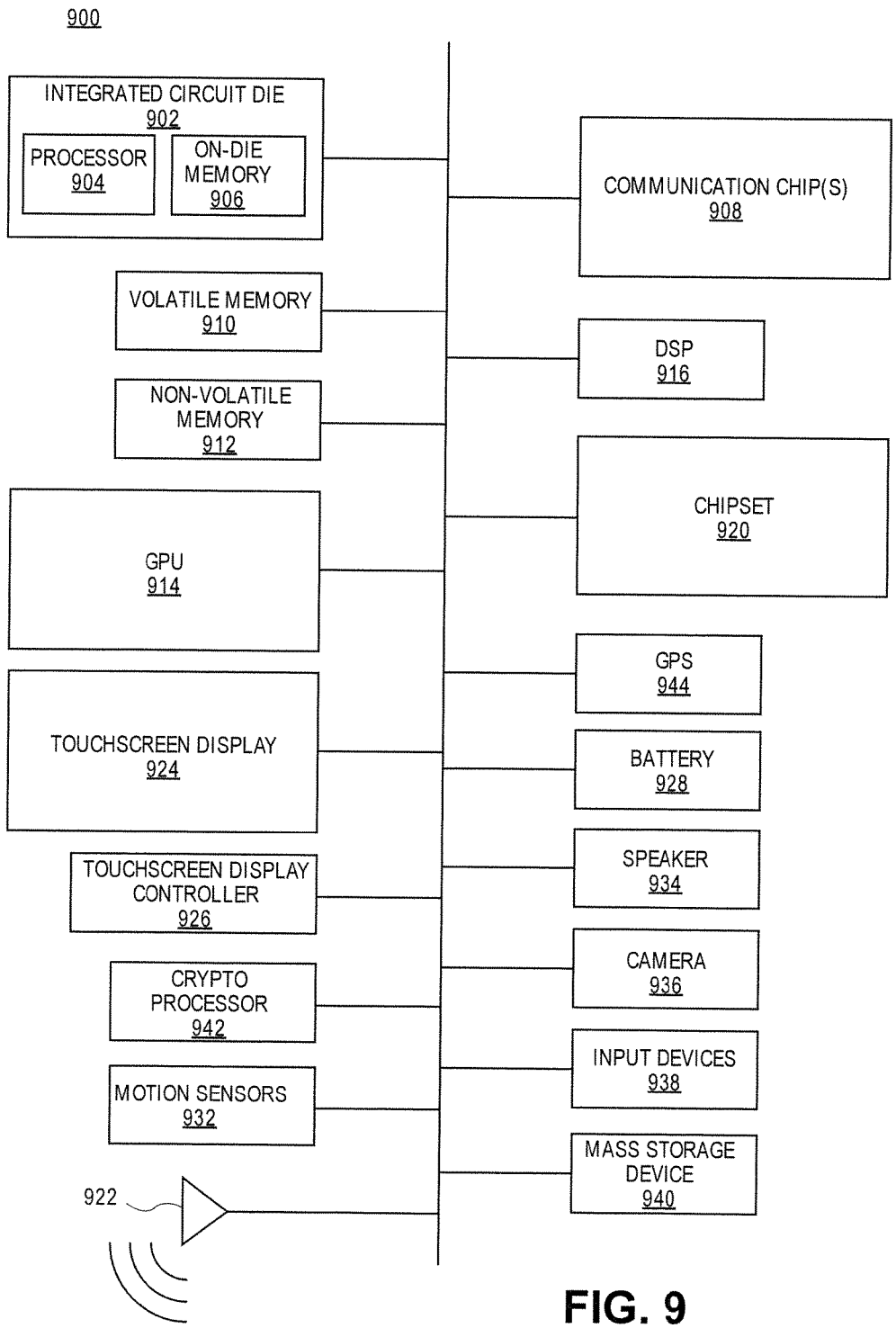
FIG. 9 illustrates an embodiment of a computing device.

FIG. 9 illustrates computing device 900 in accordance with one embodiment. Computing device 900 may include a number of components. In one embodiment, these components are attached to one or more motherboards. In an alternate embodiment, these components are fabricated onto a single system-on-a-chip (SoC) die rather than a motherboard. The components in computing device 900 include, but are not limited to, integrated circuit die 902 and at least one communication chip 908. In some implementations, communication chip 908 is fabricated as part of integrated circuit die 902. Integrated circuit die 902 may include central processing unit (CPU) 904 as well as on-die memory 906, often used as cache memory, that can be provided by technologies such as embedded DRAM (eDRAM) or spin-transfer torque memory (STTM or STTM-RAM).

Computing device 900 may include other components that may or may not be physically and electrically coupled to the motherboard or fabricated within an SoC die. These other components include, but are not limited to, volatile memory 910 (e.g., DRAM), non-volatile memory 912 (e.g., ROM or flash memory), graphics processing unit 914 (GPU), digital signal processor 916, crypto processor 942 (a specialized processor that executes cryptographic algorithms within hardware), chipset 920, antenna 922, display or touchscreen display 924, touchscreen controller 926, battery 928 or other power source, a power amplifier (not shown), global positioning system (GPS) device 944, compass 930, motion coprocessor or sensors 932 (that may include an accelerometer, a gyroscope, and a compass), speaker 934, camera 936, user input devices 938 (such as a keyboard, mouse, stylus, and touchpad), and mass storage device 940 (such as hard disk drive, compact disk (CD), digital versatile disk (DVD), and so forth).

Communications chip 908 enables wireless communications for the transfer of data to and from computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 908 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 900 may include a plurality of communication chips 908. For instance, first communication chip 908 may be dedicated to shorter range wireless communications such as Wi-Fi and Bluetooth and second communication chip 908 may be dedicated to longer range wireless communications such as GPS, EDGE, GPRS, CDMA, WiMAX, LTE, Ev-DO, and others.

Processor 904 of computing device 900 includes one or more devices, such as SOL devices, that are formed in accordance with embodiments described herein. The term "processor" may refer to any device or portion of a device that processes electronic data from registers and/or memory to transform that electronic data into other electronic data that may be stored in registers and/or memory.

Communication chip 908 may also include one or more devices, such as SOL devices, that are formed in accordance with embodiments described herein.

In further embodiments, another component housed within computing device 900 may contain one or more devices, such as SOL devices, that are formed in accordance with implementations described herein.

In various embodiments, computing device 900 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 900 may be any other electronic device that processes data.

EXAMPLES

Example 1 is an apparatus including a spin to charge conversion node; and a charge to spin conversion node, wherein an input to the spin to charge conversion node produces an output at the charge to spin conversion node.

In Example 2, the spin to charge conversion node in the apparatus of Example 1 includes a magnet coupled to at least one material, wherein a spin current generated by the magnet is operable to create a transverse charge current in the material.

In Example 3, the at least one material in the apparatus of Example 2 will exhibit a spin orbit effect in a metallic system.

In Example 4, the at least one material in the apparatus of Example 3 will produce a spin orbit coupling in response to a spin current.

In Example 5, the at least one material in the apparatus of Example 3 includes a spin hall effect (SHE) coefficient.

In Example 6, the at least one material in the apparatus of Example 2 includes a material stack comprising a first material including a non-magnetic metal and a second material including a spin orbit coupling in response to a spin current or a material having a spin hall effect coefficient.

In Example 7, the material stack in the apparatus of Example 1 further includes a two-dimensional electron gas.

In Example 8, the magnet in the apparatus of Example 2 includes a first magnet and the charge to spin conversion node comprises a second magnet, wherein the charge current is operable to induce a magnetoelectric effect to switch a direction of magnetization of the second magnet.

In Example 9, the apparatus of Example 8 further includes a channel including an electrically conductive material, wherein the charge to spin conversion node includes a capacitor inclluding the channel and the second magnet as electrodes and at least one material therebetween where, in response to a voltage on the capacitor, a direct or hybrid magnetoelectric effect is produced.

In Example 10, the spin to charge conversion node and the charge to spin conversion node in the apparatus of Example 1 include a first device of a plurality of devices, wherein the plurality of devices perform a logical operation.

In Example 11, the plurality of devices in the apparatus of Example 10 include a majority gate structure including a plurality of inputs and an output, each input including a spin to charge conversion node and a charge to spin conversion node, wherein a magnetization of the output is determined by a majority of charge current passed into the plurality of inputs.

In Example 12, the first device in the apparatus of Example 10 includes a charge output to a second device, the charge output operable to disable/enable an output signal from the second device.

Example 13 is an apparatus including a magnet comprising an input node and an output node, the input node including a capacitor operable to generate a magnetic response in the magnet and the output node including at least one spin to charge conversion material.

In Example 14, the at least one spin to charge conversion material in the apparatus of Example 13 will exhibit a spin orbit effect in a metallic system.

In Example 15, the at least one spin to charge material in the apparatus of Example 14 will produce a charge current in response to a spin current.

In Example 16, the at least one spin to charge material in the apparatus of Example 14 includes a spin Hall effect coefficient.

In Example 17, the at least one spin to charge material in the apparatus of Example 13 includes a first material of a material stack, the material stack further including a second material including a non-magnetic metal.

In Example 18, the material stack in the apparatus of Example 17 further includes a two-dimensional electron gas.

In Example 19, the magnet in the apparatus of Example 13 includes the input node and the output node includes a first device of a plurality of devices, wherein the plurality of devices perform a logical operation.

In Example 20, the plurality of devices in the apparatus of Example 19 include a majority gate structure including a plurality of inputs and an output, each input including a magnet including an input node including a capacitor operable to generate a spin current in the magnet and an output node including at least one spin to charge conversion material, wherein a magnetization of the output is determined by a majority of charge current passed into the plurality of inputs.

In Example 21, the first device in the apparatus of Example 19 includes a charge output is coupled to a second device, the charge output operable to disable/enable an output signal from the second device.

Example 22 is a method including injecting a spin current from a first magnet; converting the spin current into a charge current operable to produce a magnetoelectric interaction with a second magnet; and changing a direction of magnetization of the second magnet in response to the magnetoelectric interaction.

In Example 23, changing a direction of magnetization of the second magnet in the method of Example 22 includes changing from a direction of magnetization that is the different than the first magnet to a direction of magnetization that is the same as a direction of magnetization as the first magnet.

In Example 24, changing a direction of magnetization of the second magnet in the method of Example 22 includes changing from a direction of magnetization that is the same as the first magnet to a direction of magnetization that is different than a direction of magnetization of the first magnet.

In Example 25, an integrated circuit device operable to perform the method of any of claims 22-24.

Example 26 is a method including injecting a spin current from an input node of a magnet; and converting the spin current into a charge current at an output node of the magnet.

In Example 27, the magnet in the method if Example 26 includes includes a first device of a plurality of devices, wherein the plurality of devices perform a logical operation.

In Example 28, the plurality of devices in the method of Example 26 includes a plurality of inputs and an output, each input including a magnet including an input node including a capacitor operable to generate a spin current in the magnet and an output node including a spin to charge conversion material, the method including passing a charge current through the plurality of inputs; and generating an output comprising a direction of magnetization determined by a majority of charge current passed into the plurality of inputs.

In Example 29, the first device in the method of Example 26 is coupled to a second device, the method including passing a charge current from the first device to the second device; and disabling/enabling an output signal of the second device based on the charge current.

Example 30 is an integrated circuit devie operable to perform the method of any of examples 26-29.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. An apparatus comprising:
a spin to charge conversion node; and
a charge to spin conversion node,
wherein an input to the spin to charge conversion node produces an output at the charge to spin conversion node, wherein the spin to charge conversion node comprises a magnet coupled to at least one material, wherein a spin current generated by the magnet is operable to create a transverse charge current in the material, wherein the at least one material comprises a material stack comprising a first material comprising a non-magnetic metal and a second material comprising a spin orbit coupling in response to a spin current or a material having a spin hall effect coefficient.

2. The apparatus of claim 1, wherein the at least one material will exhibit a spin orbit effect in a metallic system.

3. The apparatus of claim 2, wherein the at least one material will produce a spin orbit coupling in response to a spin current.

4. The apparatus of claim 1, wherein the material stack further comprises a two-dimensional electron gas.

5. The apparatus of claim 1, wherein the magnet comprises a first magnet and the charge to spin conversion node comprises a second magnet, wherein the charge current is operable to induce a magnetoelectric effect to switch a direction of magnetization of the second magnet.

6. An apparatus comprising:
a spin to charge conversion node; and
a charge to spin conversion node,
wherein an input to the spin to charge conversion node produces an output at the charge to spin conversion node, wherein the spin to charge conversion node comprises a magnet coupled to at least one material, wherein a spin current generated by the magnet is operable to create a transverse charge current in the material, wherein the magnet comprises a first magnet and the charge to spin conversion node comprises a second magnet, wherein the charge current is operable to induce a magnetoelectric effect to switch a direction of magnetization of the second magnet; and a channel comprising an electrically conductive material, wherein the charge to spin conversion node comprises a capacitor comprising the channel and the second magnet as electrodes and at least one material therebetween where, in response to a voltage on the capacitor, a direct or hybrid magnetoelectric effect is produced.

7. The apparatus of claim 1, wherein the spin to charge conversion node and the charge to spin conversion node comprise a first device of a plurality of devices, wherein the plurality of devices perform a logical operation.

8. The apparatus of claim 7, wherein the plurality of devices comprise a majority gate structure comprising a plurality of inputs and an output, each input comprising a spin to charge conversion node and a charge to spin conversion node, wherein a magnetization of the output is determined by a majority of charge current passed into the plurality of inputs.

9. An apparatus comprising:
a spin to charge conversion node; and
a charge to spin conversion node,
wherein an input to the spin to charge conversion node produces an output at the charge to spin conversion node, wherein the spin to charge conversion node and the charge to spin conversion node comprise a first device of a plurality of devices, wherein the plurality of devices perform a logical operation, wherein the first device comprises a charge output to a second device, the charge output operable to disable/enable an output signal from the second device.

10. An apparatus comprising:
a magnet comprising an input node and an output node, the input node comprising a capacitor operable to generate a magnetic response in the magnet and the output node comprising at least one spin to charge conversion material, wherein the at least one spin to charge material comprises a first material of a material stack, the material stack further comprising a second material comprising a non-magnetic metal.

11. The apparatus of claim 10, wherein the at least one spin to charge conversion material will exhibit a spin orbit effect in a metallic system.

12. The apparatus of claim 11, wherein the at least one spin to charge material will produce a charge current in response to a spin current.

13. The apparatus of claim 11, wherein the at least one spin to charge material comprises a spin hall effect coefficient.

14. The apparatus of claim 10, wherein the material stack further comprises a two-dimensional electron gas.

15. The apparatus of claim 10, wherein the magnet comprising the input node and the output node comprises a first device of a plurality of devices, wherein the plurality of devices perform a logical operation.

16. The apparatus of claim 15, wherein the plurality of devices comprise a majority gate structure comprising a plurality of inputs and an output, each input comprising a magnet comprising an input node including a capacitor operable to generate a spin current in the magnet and an output node comprising at least one spin to charge conversion material, wherein a magnetization of the output is determined by a majority of charge current passed into the plurality of inputs.

17. An apparatus comprising:
a magnet comprising an input node and an output node, the input node comprising a capacitor operable to generate a magnetic response in the magnet and the output node comprising at least one spin to charge conversion material, wherein the magnet comprising the input node and the output node comprises a first device of a plurality of devices, wherein the plurality of devices perform a logical operation, wherein the first device comprises a charge output is coupled to a second device, the charge output operable to disable/enable an output signal from the second device.

18. A method comprising:
injecting a spin current from a first magnet;
converting the spin current into a charge current operable to produce a magnetoelectric interaction with a second magnet; and
changing a direction of magnetization of the second magnet in response to the magnetoelectric interaction, wherein one of the first magnet or the second magnet has an output node comprising at least one spin to charge conversion material, wherein the at least one spin to charge material comprises a first material of a material stack, the material stack further comprising a second material comprising a non-magnetic metal.

19. The method of claim 18, wherein changing a direction of magnetization of the second magnet comprises changing from a direction of magnetization that is the different than the first magnet to a direction of magnetization that is the same as a direction of magnetization as the first magnet.

20. The method of claim 18, wherein changing a direction of magnetization of the second magnet comprises changing from a direction of magnetization that is the same as the first magnet to a direction of magnetization that is different than a direction of magnetization of the first magnet.

21. A method comprising:
injecting a spin current from an input node of a magnet; and converting the spin current into a charge current at an output node of the magnet, wherein the first device is coupled to a second device, the method comprising:
passing a charge current from the first device to the second device; and
disabling/enabling an output signal of the second device based on the charge current.

22. The method of claim 21, wherein the magnet comprises a first device of a plurality of devices, wherein the plurality of devices perform a logical operation.

23. The method of claim 21, wherein the plurality of devices comprise a plurality of inputs and an output, each input comprising a magnet comprising an input node including a capacitor operable to generate a spin current in the magnet and an output node comprising a spin to charge conversion material, the method comprising:
passing a charge current through the plurality of inputs; and generating an output comprising a direction of magnetization determined by a majority of charge current passed into the plurality of inputs.

* * * * *